United States Patent [19]

Igarashi

[11] Patent Number: 4,713,762
[45] Date of Patent: Dec. 15, 1987

[54] VEHICLE-MOUNTED ELECTRONIC DISPLAY GAUGE BOARD WITH SERIAL DATA TRANSFER

[75] Inventor: Osamu Igarashi, Katsuta, Japan

[73] Assignee: Hitachi, Ltd., Tokyo, Japan

[21] Appl. No.: 619,377

[22] Filed: Jun. 11, 1984

[30] Foreign Application Priority Data

Jun. 13, 1983 [JP] Japan ................................. 58-105257

[51] Int. Cl.⁴ .............................................. G06F 15/20
[52] U.S. Cl. .................................... 364/424; 340/719
[58] Field of Search ............ 340/718, 719, 753, 815.2, 340/52; 364/200, 900, 464, 424, 565, 449, 460

[56] References Cited

U.S. PATENT DOCUMENTS

| | | | |
|---|---|---|---|
| 3,928,658 | 12/1975 | van Boxtel et al. | 340/719 |
| 4,311,996 | 1/1982 | Nakamura et al. | 340/719 |
| 4,376,934 | 3/1983 | Prohaska et al. | 340/753 |
| 4,402,050 | 8/1983 | Tagami et al. | 364/460 |
| 4,470,119 | 9/1984 | Hasebe et al. | 364/449 |
| 4,506,261 | 3/1985 | Lawter | 340/719 |
| 4,518,959 | 5/1985 | Ueda et al. | 340/784 |

Primary Examiner—Thomas M. Heckler
Attorney, Agent, or Firm—Antonelli, Terry & Wands

[57] ABSTRACT

Disclosed is a vehicle-mounted electronic display gauge board in which a part of a substrate constituting a display device is extended so that a microcomputer and a display drive circuit driven by information given by the microcomputer, and a terminal for outputting an instruction from the microcomputer and another terminal for inputting information by serial data transfer in accordance with the instruction.

3 Claims, 8 Drawing Figures

VEHICLE-MOUNTED ELECTRONIC DISPLAY GAUGE BOARD WITH SERIAL DATA TRANSFER

The present invention relates to a vehicle-mounted electronic display gauge board.

Conventionally, for example, in an electronic display gauge board for a car, a display element and a control circuit have been arranged separately from each other, as disclosed, for example, in Japanese Patent Application Laid-open No. 103409/80 and a large number of wirings have been required to transmit signals from the control circuit to the display element. Especially in a liquid crystal display device used in a car, a static drive has been effected in order to reduce the time required from the input of a signal to cause a part of the display element to be displayed to the actual display of that part, that is a response time, as small as possible. In such static drive, one signal line is required for one display segment, and the number of wirings is very large in such a car gauge board which has a large number of display segments.

To cope with this, it has been considered to dispose a display element and at least a control circuit to drive the display element on one and the same substrate. That is, for example in the case where a liquid crystal display element is used, a part of a glass substrate forming an outer frame of the liquid crystal display element is extended so as to mount thereon an LSI circuit for driving the display element. Thus, lead wires required for wiring between the display element and the drive circuit become unnecessary and it is sufficient to provide only control terminals of the drive circuit on the substrate on which the display element is to be incorporated. In such an arrangement, however, the reduction in number of lead wires is not sufficient because numbers of lead wires are still required between the drive circuit and a microcomputer associated with the drive circuit, as will be described later more in detail.

An object of the present invention is therefore to provide a vehicle-mounted electronic display gauge board in which it is intended to further reduce wiring of lead wires.

To achieve this object, in the vehicle-mounted electronic display gauge board according to the present invention, a part of a substrate constituting a display device is extended so that a microcomputer and a display drive circuit driven by information given by the microcomputer, and a terminal for outputting an instruction from the microcomputer and another terminal for inputting information by serial data transfer in accordance with the instruction.

Other features and advantages of the present invention will be apparent from the following description taken in connection with the accompanying drawings, in which.

Figure 1:
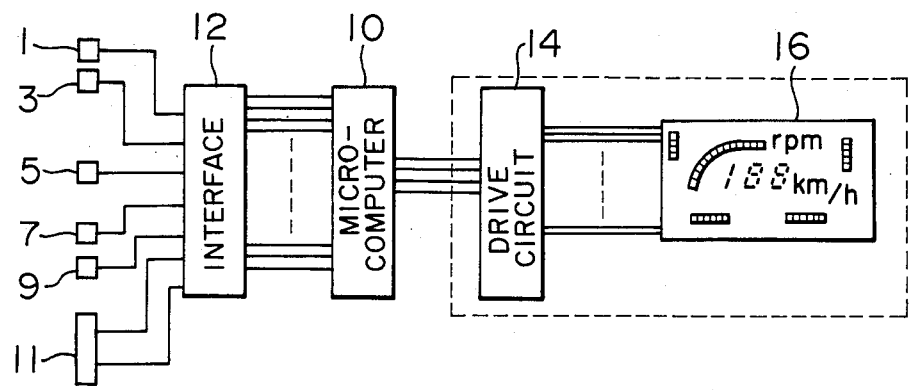
FIG. 1 is a schematic diagram showing an example of the conventional vehicle-mounted electronic display gauge.
Figure 2:
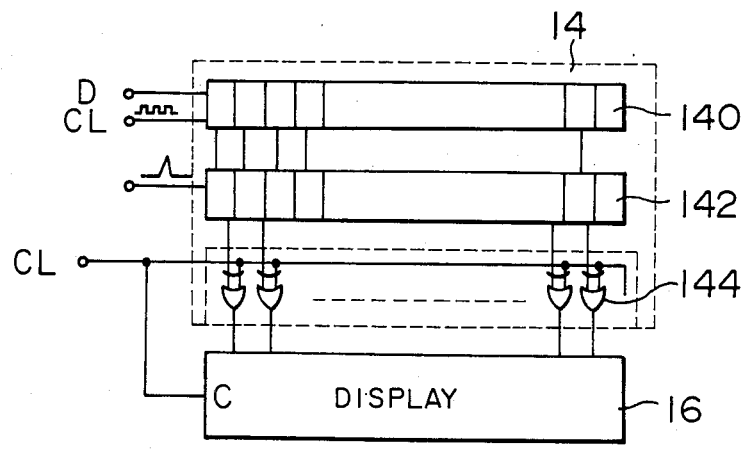
FIG. 2 is a circuit diagram showing an example of a drive circuit mounted on the above-mentioned vehicle-mounted electronic display gauge board.

Prior to the description of preferred embodiments of the present invention, an example of the above-mentioned conventional vehicle-mounted electronic display gauge will be described more in detail, with reference to FIG. 1, for the purpose of better understanding of the present invention. In FIG. 1, there are provided a vehicle speed sensor 1, an engine revolution sensor 3, an engine temperature sensor 5, a residual fuel amount sensor 7, an oil pressure sensor 9, and a monitor circuit 11 including various kinds of sensors for generating an alarm, and the respective outputs of the sensors are inputted to a microcomputer 10 the output of which is in turn applied to a drive circuit 14. As described above, a part of a glass substrate constituting an outer frame of a liquid crystal element 16 is extended and the drive circuit 14 is mounted on the extended part, so that the wiring between the drive circuit 14 and the liquid crystal display element 16 is achieved by a vapor deposition wiring layer formed on the glass substrate. As shown in detail in FIG. 2, the drive circuit 14 includes a shift register 140 having a plurality of bits, and a latch circuit 142 for temporarily storing plural outputs from the shift register 140. The latch circuit 142 has a plurality of bits which are the same in number as the bits of the shift register 140, and each of the respective outputs of the latch circuit 142 is applied to one of two input terminals of corresponding one of exclusive OR circuits 144. A clock pulse having a predetermined frequency is commonly applied to the other input terminals of the respective exclusive OR circuits 144. The outputs of the respective exclusive OR circuit 144 are correspondingly respectively applied to input terminals of segments of the liquid crystal display element 16. The above-mentioned clock pulse is applied also to a common terminal C of the liquid crystal display element 16. The above-mentioned shift register 140 has a data input terminal D and a clock input terminal C so that data is inputted through the data input terminal D in synchronism with the clock pulse. When all the bits are in the shift register 140, the latch circuit 142 is triggered so that the data stored in the shift register 140 as its contents at that time are temporarily stored in the latch circuit 142 and the crystal liquid display element 16 is lit in accordance with the contents of the latch circuit 142.

In this arrangement, however, seven or eight lead wires are required for wiring between the computer 10 and the drive circuit 14 controlled by the computer 10. Accordingly, the wiring is not sufficiently reduced in number of the wirings.

Figure 3:
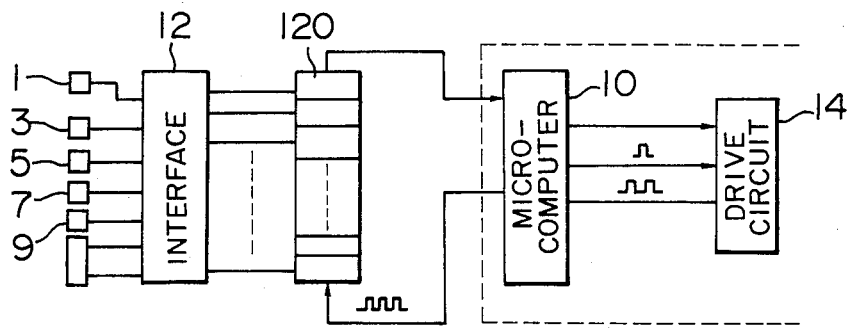
FIG. 3 is a schematic diagram showing an embodiment of the vehicle-mounted electronic display gauge according to the present invention.

Referring to FIG. 3 et seq., preferred embodiments of the present invention will be now described.

FIG. 3 is a circuit diagram showing an embodiment of the vehicle-mounted electronic display gauge according to the present invention. In the drawing, the same reference numeral as that used in FIG. 1 represents the same component. The embodiment of FIG. 3 is different from the conventional device of FIG. 1 in that data are transferred in the serial fashion between a microcomputer 10 and an interface 12. That is, the respective outputs of the interface 12 are inputted into a parallel-in-serial-out shift register 120. The data in the shift register 120 are successively transferred to the microcomputer 10 in synchronism with a control or synchronizing signal from the microcomputer 10. In the thus arranged embodiment, the microcomputer 10 and a drive circuit 14 are mounted on an extended portion of a glass substrate constituting an outer frame of a liquid crystal display element.

Figure 4:
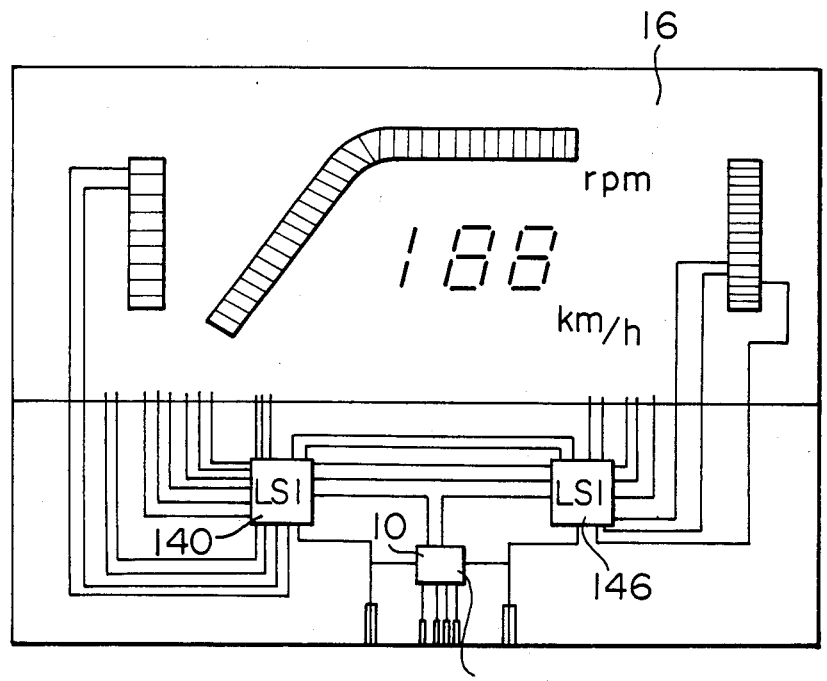
FIG. 4 is a plan view showing a liquid crystal display element on which the microcomputer and the drive circuit are mounted in the embodiment according to the present invention.
Figure 5:
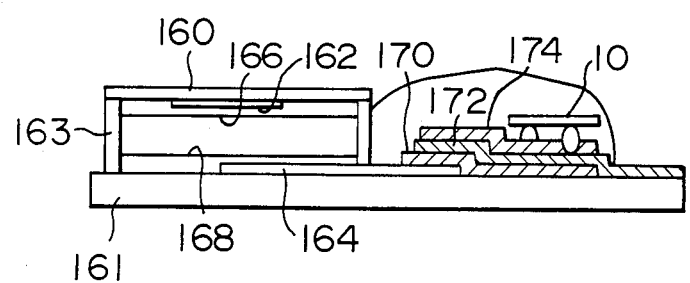
FIG. 5 is a cross-section of the liquid crystal display element of FIG. 4.

FIGS. 4 and 5 are a plan and a cross-section, respectively, showing the liquid crystal display element on which the microcomputer and the drive circuit are mounted. In the drawings, a main surface of a substrate 161 is divided into two regions one of which is formed into a display region. That is, a glass substrate 160 is disposed in opposition to the above-mentioned substrate 161 to constitute a cell whose side walls are formed by a sealing member 163, in which a crystal liquid is sealed. A transparent conductive film 164 is formed on the surface of the substrate 161 within the cell and the transparent conductive film 164 is extended to a part of the substrate 161 outside the cell. A transparent conductive film 162 is also formed on the surface of the glass substrate 160 opposed to the substrate 161. Orientation films 166 and 168 are formed on the opposite surfaces of the respective substrates 160 and 161, the films 166 and 168 covering the transparent conductive film 162 and partly the conductive film 164. A wiring layer is formed on a part of the substrate 161 outside the cell, the wiring layer including chromium conductors 170 and 174 and a copper conductor 172 connected to the transparent conductive film 164 at its extended portion outside the cell. The microcomputer 10 and liquid crystal driving LSIs 140 and 146 are mounted on the wiring layer and connected thereto, for example, by face-down bonding. Electrodes for data transfer of the microcomputer 10 and for power supply are formed on the end surface of the substrate 161.

In the thus arranged liquid crystal display device provided with the microcomputer which performs serial data transfer and the liquid crystal display device driven by the microcomputer, the wirings can be remarkably reduced in number between the display element section and the circuit section, resulting in reduction in cost and improvement in reliability. The present invention has a further advantage that the requirement to provide the display element and the circuit section at the same location as in the conventional electronic gauge board is entirely obviated, because the computing circuit is incorporated in the display element and the number of the wirings is small. Accordingly, on the assumption that the display is of course disposed at the same position as in the conventional case, it is possible to provide the interface circuit at an optimum position standing on the general viewpoint with respect to the inputs from sensors at various locations. This results in a further advantage that a margin is formed at the rear side of the gauge board so as to facilitate car assembling.

Figure 6:
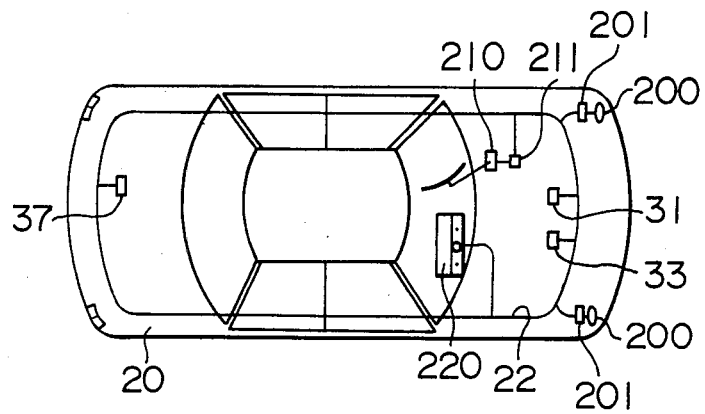
FIGS. 6 to 8 are schematic diagrams showing a further embodiment of the vehicle-mounted electronic display gauge according to the present invention.
Figure 7:
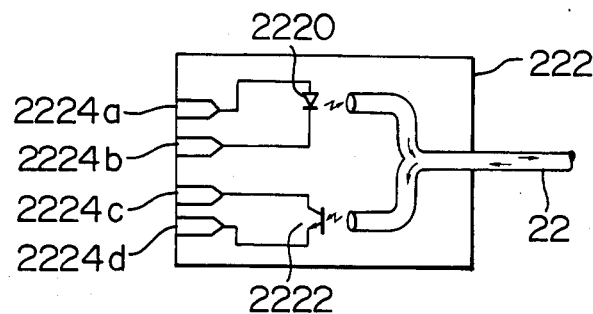
Figure 8:
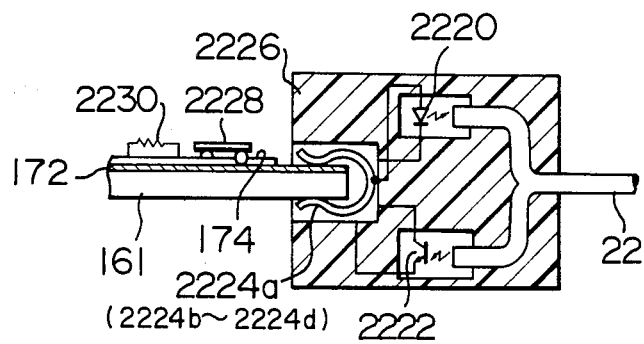

FIGS. 6 to 8 are schematic diagrams showing a further embodiment of the vehicle-mounted electronic display gauge according to the present invention. In FIG. 6, an optical fiber 22 is disposed in a vehicle or car 20 and connected to various loads such as a lighting control circuit 201 for controlling the on/off of a headlamp 200, a wiper control circuit 211 for controlling the on/off of a wiper 210, to various sensors such as a vehicle speed sensor 31, a revolution sensor 31, a residual fuel amount sensor 37, and to an electronic gauge board 220 mounted in the vehicle, through branches formed from the optical fiber 22. A photo-electric converting connector 222 is inserted between the optical fiber 22 and the above-mentioned loads as shown in FIG. 7. In FIG. 7, the optical fiber 22 has two branch ends so that a light emission diode 2220 is provided in opposition to the tip of one of the branch ends and a phototransistor 2222 is provided in opposition to the tip of the other branch end. The terminals of the light emission diode 2220 and the phototransistor 2222 are connected to connector terminals 2224a to 2224d. FIG. 8 shows a specific arrangement of the photo-electric converting connector 222. Each of the connector terminals 2224a to 2224d has a U-shaped configuration so as to perform a spring action and sandwiches a corresponding one of the electrodes of the above-mentioned glass substrate 161 of the liquid crystal display element. These connector terminals 2224a to 2224d are inserted into a recess portion of a connector body 2226 in which the above-mentioned light emission diode 2220, the phototransistor 2222, and the optical fiber 22 are embedded. A transistor 2228 for driving the light emission diode 2220 and a load resistor 2230 of the photo-transistor 2222 are fixedly mounted on the above-mentioned glass substrate 161. In the thus arrangement, the signal transfer between various sensors and the microcomputer 10 can be effected by using only one optical fiber 22. Further, in the case where processing can not be attained only by the microcomputer, a light transmission control LSI may be fixedly mounted on the glass substrate.

Although the embodiments have been described above, only by way of example, as to a liquid crystal display device, the present invention is not limitted to this and can be of course applied to other type display device such as a gass discharge element, a fluorescent display tube, or the like.

As will be apparent from the description made above, according to the present invention, the wiring can be reduced in number of the lead wires or the like used in the vehicle-mounted electronic display gauge board.

What is claimed is:

1. A vehicle-mounted electronic display gauge board comprising:
   a display device for mounting in a vehicle and having a substrate which has an extended portion;
   a microcomputer mounted on said extended portion of said substrate and having an input for receiving external data representing various conditions and an output for producing information;
   a display drive circuit mounted on said extended portion of said substrate for driving said display device in response to the information from said microcomputer;
   a first terminal mounted on said extended portion of said substrate for outputting an instruction from said microcomputer;
   a second terminal mounted on said extended portion of said substrate for inputting said external data through serial transfer into said microcomputer in response to said instruction; and
   transmitting means for transmitting said instruction from said first terminal and for transmitting said external data to said second terminal, said transmitting means including photo-electric converting means for converting the instruction from said first terminal into a light signal and for converting a light signal representing said external data into an electric signal to be applied to said second terminal, and an optical fiber for transmitting said light signal representing said instruction from said photoelectric converting means and for transmitting said light signal representing said external data to said photo-electric converting means;

wherein said photo-electric converting means includes a photo diode for converting the instruction from said first terminal into said light signal, a photo transistor for converting said light signal representing said external data into said electric signal to be applied to said second terminal, a first connector terminal connected to the input of said photo diode and adapted to be connected to said first terminal, a second connector terminal connected to the output of said photo transistor and adapted to be connected to said second terminal, and a connector for accommodating said photo diode, photo transistor, and first and second connector terminals therein, and wherein an end portion of said optical fiber is divided into two parts and accommodated in said connector body, the divided two parts being optically coupled with said photo transistor and said photo diode in said connector body, respectively.

2. A vehicle-mounted electronic display gauge board according to claim 1, wherein said transmitting means transmits said instruction from said first terminal in a direction away from said substrate and transmits said external data in a direction toward said substrate to said second terminal mounted on said substrate.

3. A vehicle-mounted electronic display gauge board according to claim 1, wherein said external data representing various conditions represents various conditions of the vehicle, and said transmitting means transmits said external data of the various conditions of the vehicle to said second terminal mounted on said substrate.

* * * * *